(12) United States Patent
Ju

(10) Patent No.: US 6,572,397 B2
(45) Date of Patent: Jun. 3, 2003

(54) STRUCTURE OF A BALL GRID ARRAY IC SOCKET CONNECTION WITH SOLDER BALL

(75) Inventor: Ted Ju, Keelung (TW)

(73) Assignee: Lotes Co., Ltd., Keelung (TW)

(*) Notice: Subject to any disclaimer, the term of this patent is extended or adjusted under 35 U.S.C. 154(b) by 91 days.

(21) Appl. No.: 09/972,710

(22) Filed: Oct. 9, 2001

(65) Prior Publication Data

US 2003/0068916 A1 Apr. 10, 2003

(51) Int. Cl.[7] .................................................. H01R 4/50
(52) U.S. Cl. ............................. 439/342; 439/70; 439/83
(58) Field of Search ........................... 439/342, 83, 66, 439/70, 71, 331

(56) References Cited

U.S. PATENT DOCUMENTS 6,056,558 A * 5/2000 Lin et al. ...................... 439/83
6,142,792 A * 11/2000 Yang .............................. 439/70
6,217,348 B1 * 4/2001 Lin et al. ....................... 439/83

* cited by examiner

Primary Examiner—Tho D. Ta
Assistant Examiner—James Harvey
(74) Attorney, Agent, or Firm—Leong C. Lei

(57) ABSTRACT

An improved structure of a ball grid array IC socket connection with solder ball is disclosed. The improved structure of a Ball Grid Array IC socket connection solder ball having a plurality of conductive plates corresponding to IC pins is characterized in that the conductive plates are flexible bent plate bodies for insertion and clipping with the IC pins, and the other end of the plate body for insertion into the IC pins is formed into a branching opening for elastic alloy clipping of the solder ball so that the solder ball is securely clipped and the other end of the plate body is formed into a bending wall for insertion into the IC pin.

1 Claim, 6 Drawing Sheets

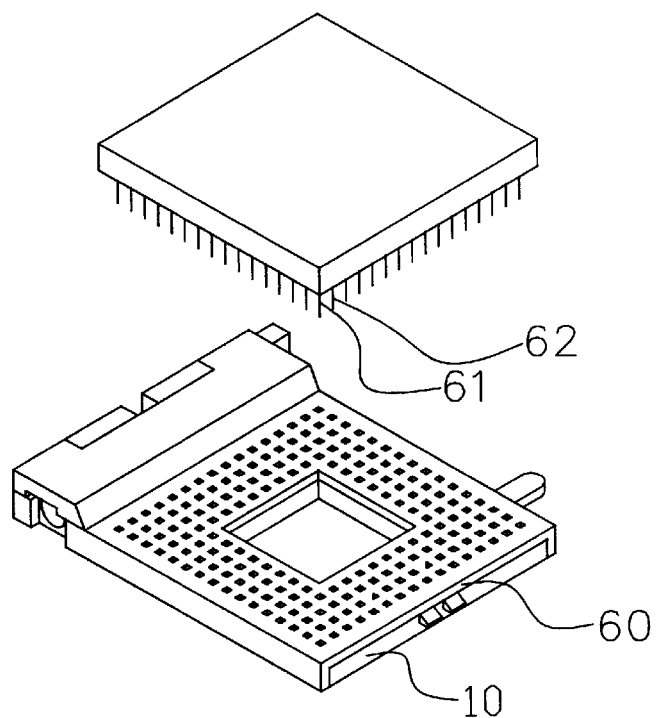
PRIOR ART
FIG. 1
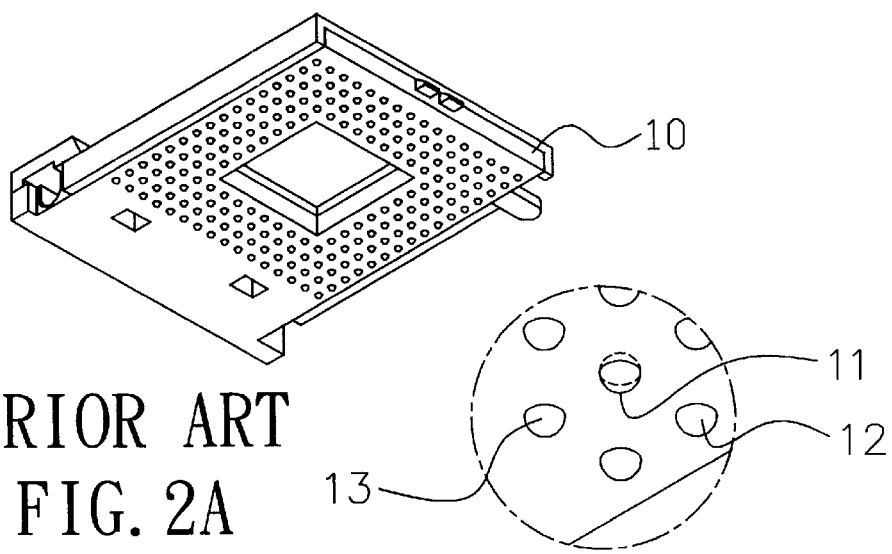
PRIOR ART
FIG. 2A
PRIOR ART
FIG. 2B

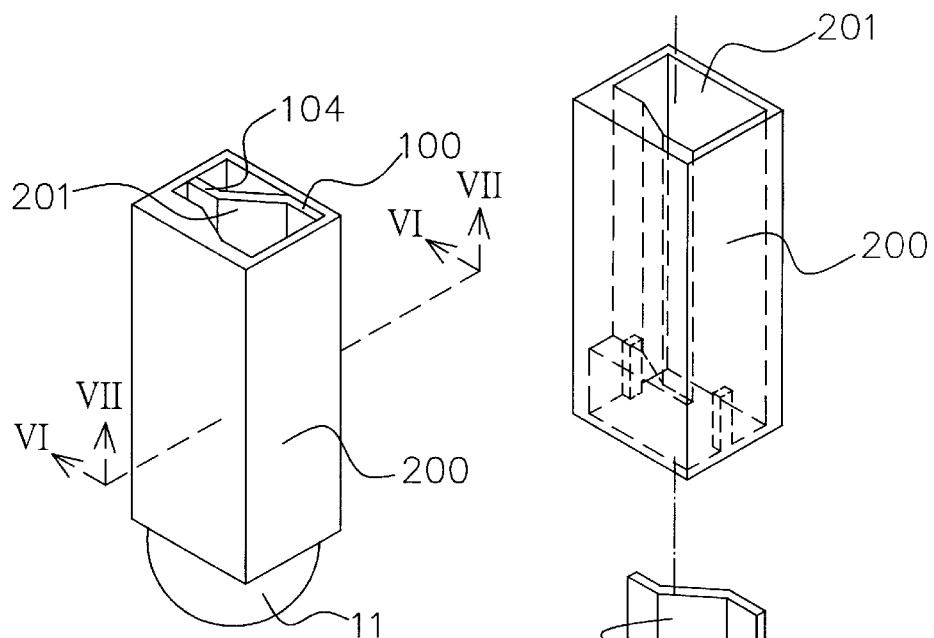
FIG. 4
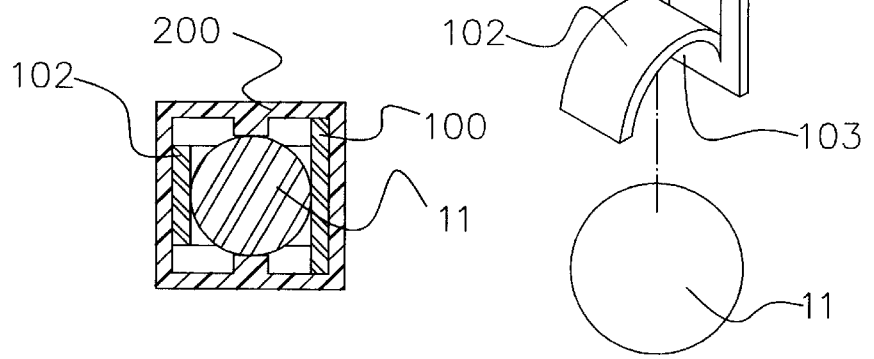
FIG. 7
FIG. 5

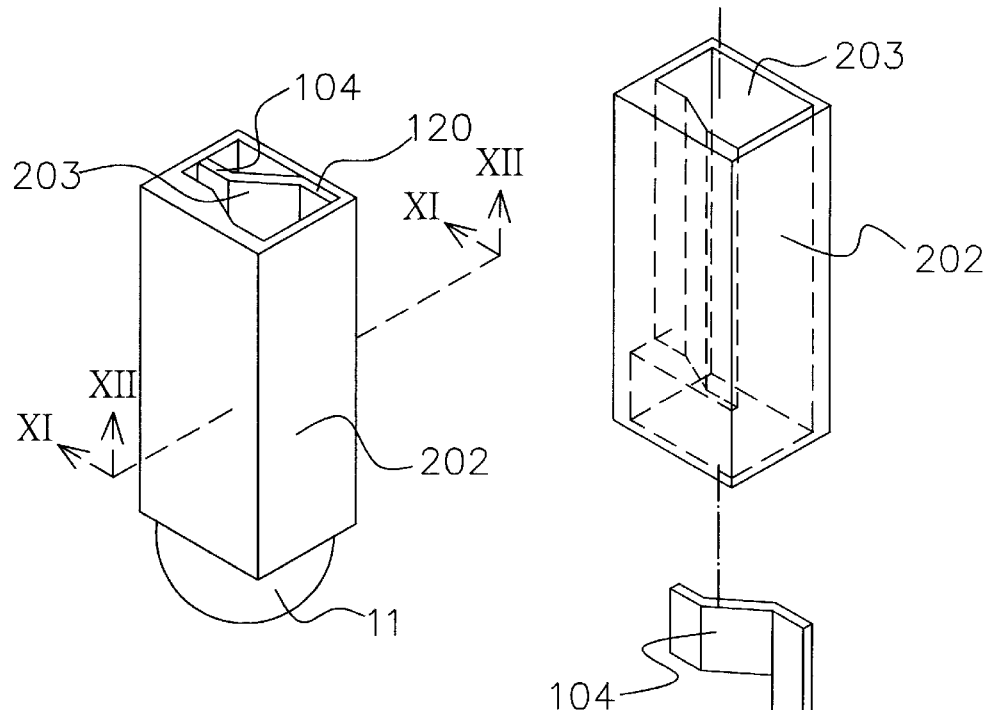
FIG. 9
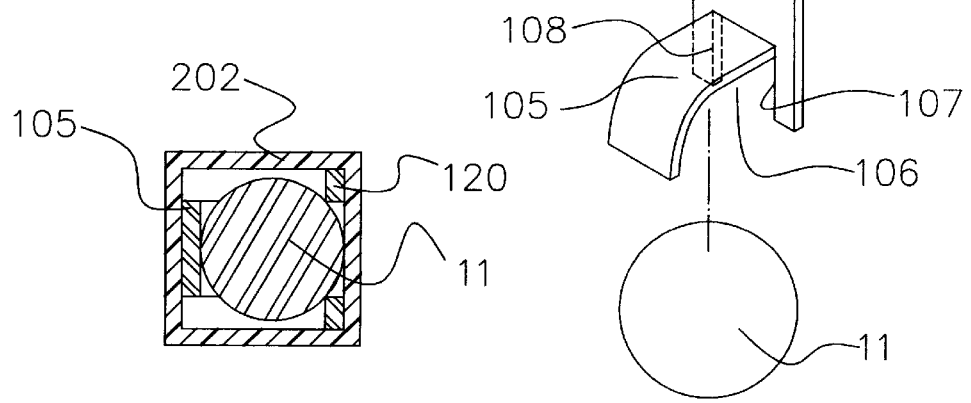
FIG. 12
FIG. 10

STRUCTURE OF A BALL GRID ARRAY IC SOCKET CONNECTION WITH SOLDER BALL

BACKGROUND OF THE INVENTION (a) Field of the Invention

The present invention relates to an improved structure of a ball grid array IC socket connection with solder ball, and in particular, an IC socket having a plurality of conductive clipping plates with clipping solder ball structure so as to eliminate the requirement of pre-soldering of solder ball onto the conductive clipping plates.

(b) Description of the Prior Art

Ball Grid Array IC socket is a new IC socket structure with solder balls to replace the insertion pins protruded from the bottom of the socket, and surface mounting technology is employed to mount the corresponding soldering position of the solder balls over the surface of the circuit board. FIG. 1 is a perspective view of Ball Grid Array CPU socket. FIG. 2A is a bottom view of the socket shown in FIG. 1 and FIG. 2B is an enlarged view of a portion of FIG. 2A. The number of mounting pins of the corresponding IC pins of the socket is changed to a socket with semi-engaging solder balls 11, 12, 13 such that the bottom surface of the CPU socket 10 is protruded half the height of that of the solder balls 11, 12, 13.

FIG. 3 is a perspective view of a conventional Ball Grid Array CPU socket connected with solder ball. Within the socket 10, corresponding to IC pins, a plurality of straight slots 20, 21, 22 are formed. Each straight slot 20, 21, 22 is squeezed with a bending, U-shaped conductive clipping plate 30 which is an elastic thin strap. The bottom end of the conductive clipping plate 30 does not protrude from the bottom of the socket 10, and a solder ball 40 is mounted to the bending section of the plate 30 such that the upper half portion of the solder ball 40 is engaged at the straight slot 20 and is mounted to the conductive clipping plate 30, and the lower half portion of the solder ball 40 is used for future mounting to a circuit board 50 at the soldering point. At an appropriate position on the two side walls of the conductive clipping plate 30, at least a pair of clipping walls 31, 32 is provided for clipping with the IC pins 61, 62 of a top transverse board 60 mounted onto the socket 10. This conductive plate 30 together with the ball solder 40 has the following drawbacks:

(1) A soldering process is required to pre-mount the solder ball onto a conductive clipping plate and after that when the CPU socket is be adhered to the circuit board, the solder ball has to be heated again, and accordingly, repeating of soldering processes is troublesome and the fabrication processes cannot be expedite; and (2) Due to numerous soldering points, chances of pollution due to air pollutant are increased and therefore the quality of conductivity at the soldered point is lowered, and further, the connection structure of the solder ball is inappropriate.

Accordingly, it is an object of the present invention to provide an improved structure of a Ball Grid Array IC socket connection with solder ball which mitigates the above drawbacks.

SUMMARY OF THE INVENTION

Accordingly, it is an object of the present invention to provide an improved structure of a Ball Grid Array IC socket connection with solder ball, wherein the Ball Grid Array IC socket connecting solder ball having a plurality of conductive plates corresponding to IC pins is characterized in that the conductive plates are flexible bent plate bodies for insertion and clipping with the IC pins, and the other end of the plate body for insertion into the IC pins is formed into a branching opening for elastically clipping of the solder ball so that the solder ball is securely clipped and the other end of the plate body is formed into a bending wall for insertion into the IC pin.

Yet another object of the present invention is to provide an improved structure of a ball grid array IC socket connection with solder ball, wherein a wall block is provided to an IC socket and a straight through slot is provided to the wall block and the plate body is exactly secured by the through slot, preventing the plate body being dislocated from the through hole of the wall block.

Other object and advantages of the present invention will become more apparent from the following description taken in conjunction with the accompanying drawings.

BRIEF DESCRIPTION OF THE DRAWINGS

FIG. 1 is a perspective view of a Ball Grid Array CPU socket.

FIG. 2A is a perspective view, viewing from the bottom of the socket of FIG. 1.

FIG. 2B is an enlarged view of a portion of FIG. 2A.

FIG. 4 is a perspective view showing the connection of the conductive clipping plate of the solder ball with the Ball Grid Array IC socket in accordance with the present invention.

FIG. 5 is a perspective exploded view showing the connection of the conductive clipping plate of the solder ball with the Ball Grid Array IC socket in accordance with the present invention.

FIG. 7 is a sectional view along line VII—VII of FIG. 4 of the present invention.

FIG. 9 is a perspective view showing the connection of another type of conductive clipping plate of the solder ball with the Ball Grid Array IC socket in accordance with the present invention.

FIG. 10 is a perspective exploded view showing the connection of another type of conductive clipping plate of the solder ball with the Ball Grid Array IC socket in accordance with the present invention.

FIG. 12 is a sectional view along line XII—XII of FIG. 9 of the present invention.

DETAILED DESCRIPTION OF THE PRESENT INVENTION

Figure 3:
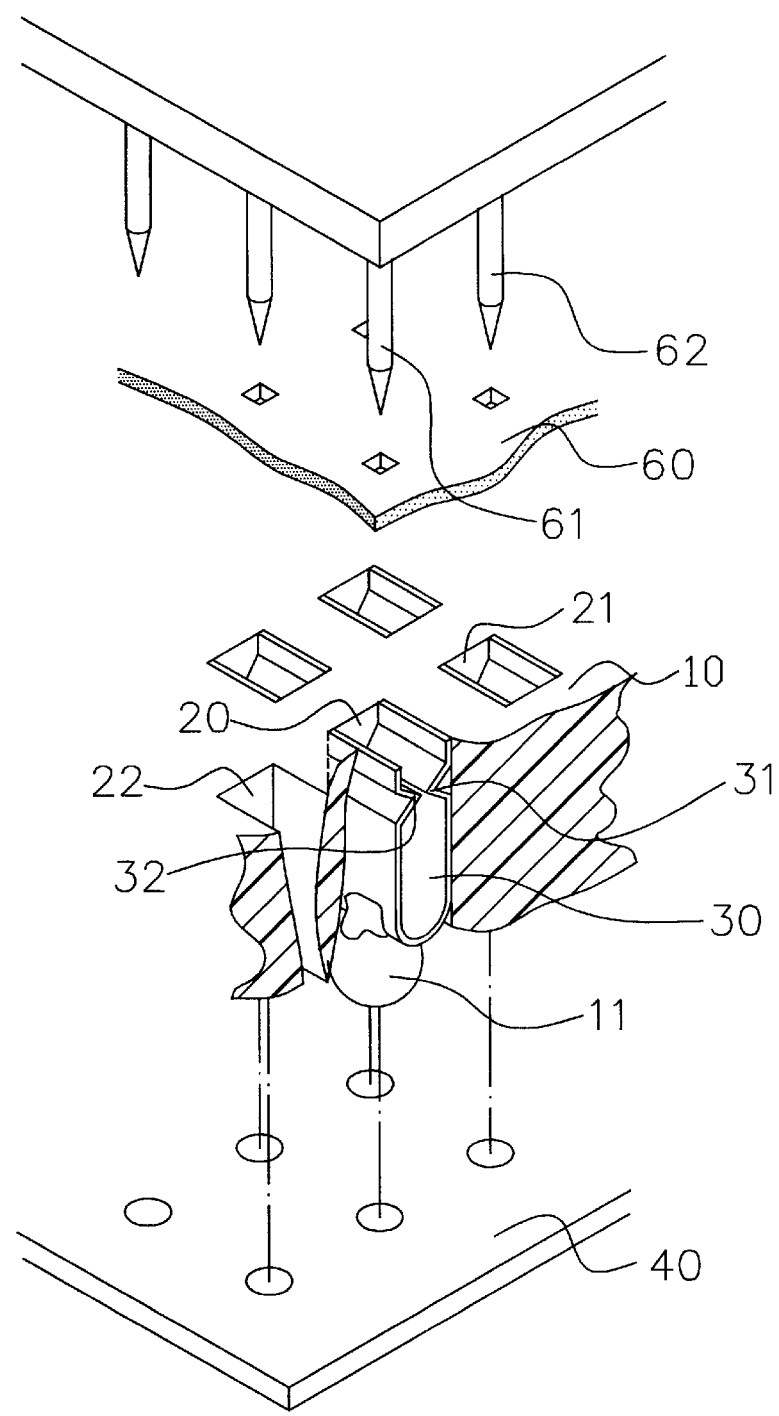
FIG. 3 is a perspective view of a conventional Ball Grid Array CPU socket connected with solder ball structure.

FIGS. 1 and 2A respectively show a perspective view and the bottom perspective view of a Ball Grid Array IC socket, and FIG. 3 is a perspective view of a conventional Ball Grid Array CPU socket connected with solder ball structure.

Referring to FIGS. 4 and 5, there is shown a perspective view and a perspective exploded view of the connection of the conductive clipping plate of the solder ball with the Ball Grid Array IC socket in accordance with the present invention. As shown in the figures, there is a plate body 100 which is a conductive clipping plate and is flexible, for insertion and clipping of IC pins. The plate body 100 for inserted into the other end of the IC pins is formed into a branching opening 103 with two sides to clip a solder ball 11 for secured mounting with the solder ball 11. When the plate body 100 clips onto the solder ball 11, the branching opening 103 is located at a height higher than half the height of the solder ball 11. In view of the structure of the plate body 100, a slit 101 is formed with one side being connected to the plate body 100 to form a substantial arc-shaped blocking plate 102. The arc-shaped blocking plate 102 sits onto the top of the solder ball 11. The other end of the plate body 100 for connection with the IC pins is formed into a bent wall 104 for the insertion and clipping of IC pins. The external of the plate body 100 can be inserted into a straight through slot wall block 200 and is fastened thereto.

In accordance with the present invention, FIG. 5 shows a perspective exploded view of the Ball Grid Array IC socket having the wall block 200 and the plate body 100. The wall block 200 has a through slot 201 which can exactly hold the plate body 100 and the plate body 100 is prevented from dislocation from the wall block 200. In accordance with the present invention, the wall block 200 is made from plastic material, facilitating the formation of various shapes of the slot 201.

Figure 6:
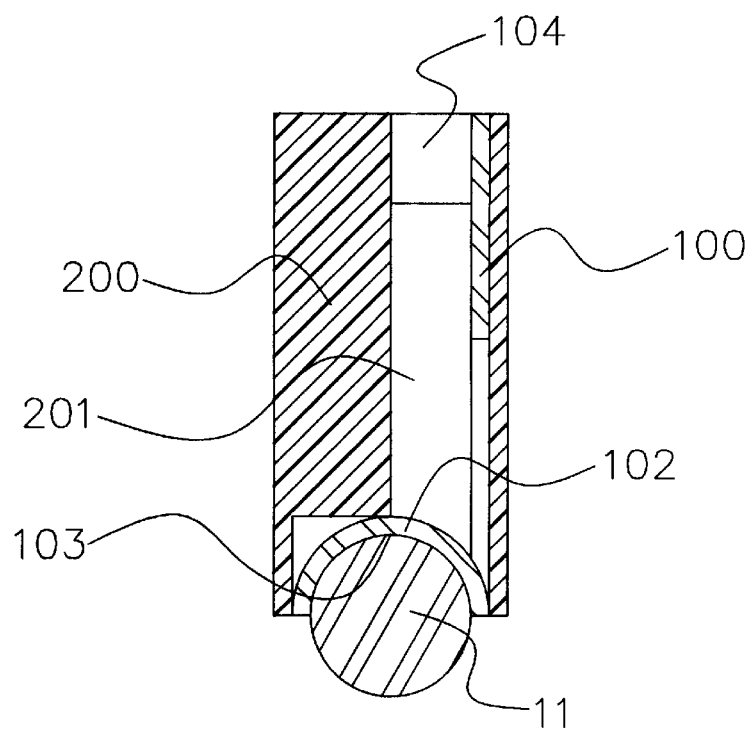
FIG. 6 is a sectional view along line VI—VI of FIG. 4 of the resent invention.
Figure 8:
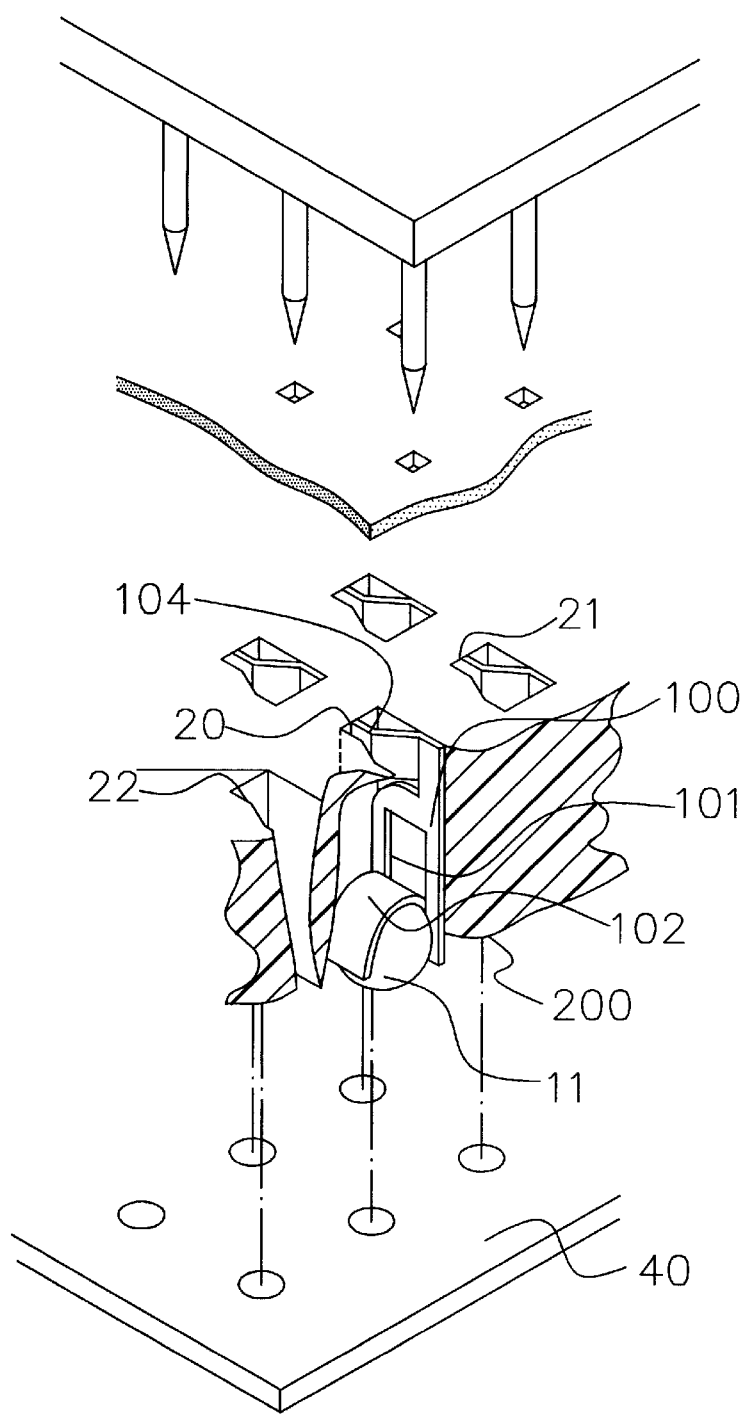
FIG. 8 is a perspective view showing the connection of the solder ball with the Ball Grid Array IC socket of the present invention.

FIGS. 6 and 7 are sectional views of the Ball Grid Array IC socket. As shown in the figures, the blocking plate 102 can hold and clip the top portion of the solder ball 11, and the surrounding of the solder ball 11 is held and clipped by the plate body 100 and the corresponding wall of the slot 201. As shown in FIG. 8, the external of the plate body 100 has the size of the through slots 20, 21, 22 of the CPU socket 10 and is entire inserted therein. About half the height of the solder ball 11 is protruded above the socket 10. When the entire structure with the solder ball 11 is placed onto a circuit board 40, the board ball 11 will be adhered onto the circuit board 40 by heating. The clipping surface of the solder ball 11 will be melted and adhered to the inner wall of the plate body 100 and the bottom face of the blocking plate 102. Thus, a good conductivity circuit board is obtained.

Figure 11:
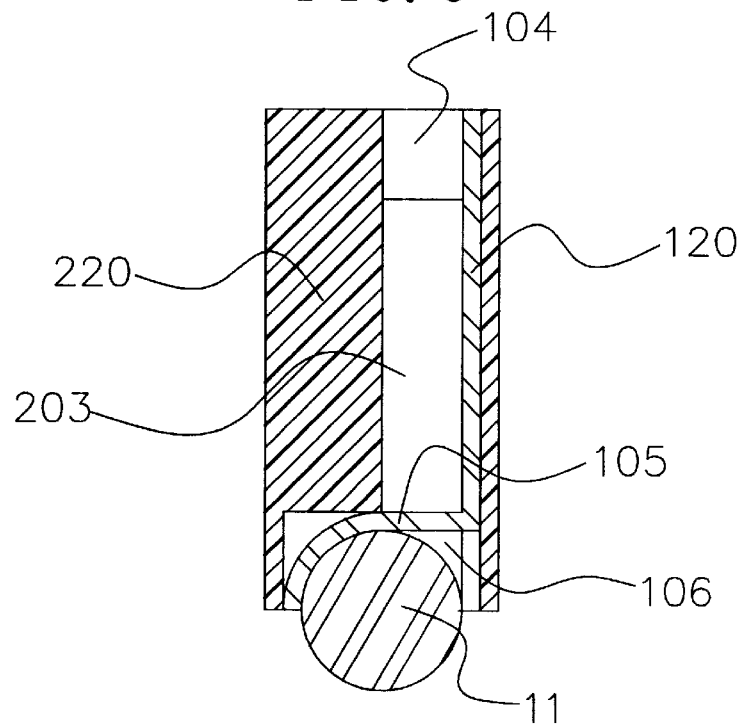
FIG. 11 is a sectional view along line XI—XI of FIG. 9 of the present invention.

Referring to FIGS. 9 and 11, a branching opening 106 is formed by slits 107, 108 formed on a plate body 120 with a blocking plate 105 being an arch-shaped joined to the plate body 120 at an appropriate height. The two slits 107, 108 are parallel on the plate body 120, the cut end of the blocking plate 105 is extended outward and the blocking plate 105 can sit onto the top portion of the solder ball 11, and the blocking plate 105 forms a branching opening 106, allowing the clipping of the solder ball 11 with the plate body 120. The plate body 120 can be placed within a through slot 203 provided on a wall block 202. The wall block 202 can hold the plate body 120, and the plate body 120 is prevented from dislocation from the wall block 202. In accordance with the present invention, the wall block 202 is made from plastic material, facilitating the formation of various shapes of the slot 203. As shown in FIGS. 11 and 12, there is shown the sectional view of the Ball Grid Array CPU socket of the present invention. In accordance with the present invention, the solder ball 11 can be secured to the circuit board.

While the invention has been described with respect to preferred embodiment, it will be clear to those skilled in the art that modifications and improvements may be made to the invention without departing from the spirit and scope of the invention. Therefore, the invention is not to be limited by the specific illustrative embodiment, but only by the scope of the appended claims.

I claim:

1. A structure of a Ball Grid Array IC socket connection with solder balls comprising:

a socket having a plurality of wall blocks defining a plurality of through slots;

a plurality of conductive plates, each conductive plate is fitted into one of said through slots;

each of said plurality of conductive plates have an upper end for insertion and clipping with IC pins and a lower end formed into a branching opening for elastically clipping of a solder ball;

said upper end of each of said plurality of conductive plates extends in a direction from a side of said plurality of conductive plates;

said branching opening is located at a height higher than one-half of a height of said solder ball;

an arc-shaped blocking plate is formed on each of said conductive plates and extends in a direction from a front face of each of said conductive plates;

said direction of said upper end is transverse to said direction of said arc-shaped blocking plate;

two parallel legs are formed on said lower end of said plate bodies;

said wall blocks have projections that extend into said slot to substantially center said solder ball with respect to said arc-shaped blocking plate;

said arc-shaped blocking plate is substantially bent about a center, said arc-shaped blocking plate has a radius first position that extends from said center to a distal end of said arc-shaped blocking plate, and a radius second position that extends from said center to said conductive plate;

an angle of substantially 180 degrees is between said radius first position and said radius second position;

whereby an upper portion of said solder ball is held by said arc-shaped blocking plate, said legs, and corresponding wall of a respective one of said through slots without soldering.

* * * * *